(12) United States Patent
Shibib

(10) Patent No.: US 7,190,563 B2
(45) Date of Patent: Mar. 13, 2007

(54) ELECTROSTATIC DISCHARGE PROTECTION IN A SEMICONDUCTOR DEVICE

(75) Inventor: Muhammed Ayman Shibib, Wyomissing, PA (US)

(73) Assignee: Agere Systems Inc., Allentown, PA (US)

( * ) Notice: Subject to any disclaimer, the term of this patent is extended or adjusted under 35 U.S.C. 154(b) by 383 days.

(21) Appl. No.: 10/403,570

(22) Filed: Mar. 31, 2003

(65) Prior Publication Data

US 2004/0075145 A1    Apr. 22, 2004

Related U.S. Application Data

(60) Provisional application No. 60/419,509, filed on Oct. 18, 2002.

(51) Int. Cl.
H02H 3/22    (2006.01)

(52) U.S. Cl. .......................................... 361/56; 361/111

(58) Field of Classification Search ................ 361/56, 361/57, 58, 111; 257/360, 361, 362, 363, 257/364, 365, 355, 356
See application file for complete search history.

(56) References Cited

U.S. PATENT DOCUMENTS

| | | | | |
|---|---|---|---|---|
| 5,543,650 A | * | 8/1996 | Au et al. ...................... | 257/355 |
| 5,710,689 A | * | 1/1998 | Becerra et al. ................ | 361/57 |
| 6,064,249 A | | 5/2000 | Duvvury et al. | |
| 6,097,235 A | * | 8/2000 | Hsu et al. ..................... | 327/309 |
| 6,140,683 A | * | 10/2000 | Duvvury et al. ............ | 257/360 |
| 6,222,236 B1 | | 4/2001 | Lamey | |
| 6,593,799 B2 | * | 7/2003 | De et al. ..................... | 327/534 |
| 6,671,147 B2 | * | 12/2003 | Ker et al. ..................... | 361/56 |
| 6,728,086 B2 | * | 4/2004 | Hung et al. ................... | 361/56 |
| 6,747,501 B2 | * | 6/2004 | Ker et al. ..................... | 327/310 |

OTHER PUBLICATIONS

A.Z.H. Wang et al., "An On-Chip ESD Protection Circuit with Low Trigger Voltage in BiCMOS Technology," IEEE Journal of Solid-State Circuits, vol. 36, No. 1, pp. 40-45, Jan. 2001.

* cited by examiner

Primary Examiner—Brian Sircus
Assistant Examiner—Danny Nguyen

(57) ABSTRACT

An electrostatic discharge (ESD) protection circuit for protecting a circuit from an ESD event, the ESD protection circuit comprises a metal-oxide semiconductor (MOS) device including a gate terminal, a first source/drain terminal, a second source/drain terminal and a bulk terminal, the bulk and first source/drain terminals being operatively coupled across the circuit to be protected, the gate and second source/drain terminals being coupled together; and a voltage generation circuit coupled between the bulk and gate terminals of the MOS device. The voltage generation circuit is configured to generate a voltage difference between the bulk and gate terminals of the MOS device during at least a portion of the ESD event. In this manner, a current handling capability of the MOS device is increased, thereby advantageously enabling a smaller sized device having a significantly smaller capacitance associated therewith to be employed in the ESD protection circuit.

20 Claims, 4 Drawing Sheets

ELECTROSTATIC DISCHARGE PROTECTION IN A SEMICONDUCTOR DEVICE

CROSS-REFERENCE TO RELATED APPLICATIONS

The present application claims the benefit of provisional application Ser. No. 60/419,509 filed on Oct. 18, 2002, the disclosure of which is incorporated herein by reference.

FIELD OF THE INVENTION

The present invention relates generally to electrostatic discharge (ESD) protection, and more particularly relates to ESD protection in a metal-oxide-semiconductor (MOS) device.

BACKGROUND OF THE INVENTION

The use of ESD protection circuitry for protecting an integrated circuit (IC) device from damage caused by the discharge of static electricity and/or other transient pulses (e.g., load dump) through the device is well known. An ESD event, which may include any large voltage and/or current transient pulse, may not necessarily cause immediate (i.e., catastrophic) failure of the device, but may damage only a portion of the device and/or cause a latent defect that can significantly shorten the operating life or negatively impact the reliability of the device.

Protection from ESD is critical in order to prevent damage to the gate oxide associated with, for example, a large power transistor of the metal-oxide-semiconductor (MOS) type. It is common to incorporate ESD protection circuitry for large transistors that can protect the gate oxides from damage and withstand a high current (e.g., several amperes) as a result of an ESD event. However, conventional ESD protection schemes for power transistors, including the use of zener diodes and/or grounded-gate n-type metal-oxide-semiconductor (NMOS) transistors, are generally not adequate for high frequency applications, which may require operation, for example, in a radio frequency (RF) range. This is primarily due to the large capacitances associated with traditional ESD protection structures having relatively large geometries, wide metal interconnects, large contacts, etc. Moreover, the large geometries required by such conventional ESD protection structures undesirably decrease the number of integrated circuits that can be fabricated on a given semiconductor wafer, thereby increasing the cost of manufacturing the device. Additionally, conventional ESD protection circuits often demonstrate other undesirable characteristics, such as, for example, being prone to false triggering during large signal operation of the device being protected, high leakage current, high and/or uncontrollable snapback voltage, etc.

Conventional approaches to manufacturing ESD protection structures often involve the use of several additional masks or reticles and corresponding fabrication steps. However, any increase in the number of masks and/or processing steps undesirably translates to an increase in the overall cost of IC fabrication. Moreover, each additional fabrication step presents an opportunity for the introduction of impurities into the resulting device, thus negatively impacting the manufacturing yield as well.

Accordingly, it would be advantageous to have an ESD protection circuit capable of protecting an IC device from damage caused by an ESD event without significantly impacting the high frequency performance of the device. Moreover, it would be desirable for the ESD protection circuit to be sized such that circuit density, and thus manufacturing cost, is not significantly affected.

SUMMARY OF THE INVENTION

The present invention provides techniques for protecting an IC device (e.g., an RF laterally diffused metal-oxide-semiconductor (LDMOS) power transistor) from damage resulting from an ESD event without significantly affecting the high frequency performance of the device. The compact low-capacitance ESD circuit of the present invention can be integrated into, for example, an RF LDMOS chip, and offers low leakage and high current handling capability. Additionally, the ESD circuit of the present invention can be fabricated without adding any mask levels or corresponding process steps, while occupying minimal chip area. Consequently, the cost of manufacturing the IC device is not significantly increased.

In accordance with one aspect of the invention, an ESD protection circuit for protecting a circuit from an ESD event comprises a metal-oxide semiconductor (MOS) device including a gate terminal, a first source/drain terminal, a second source/drain terminal and a bulk terminal, the bulk and first source/drain terminals being operatively coupled across the circuit to be protected, the gate and second source/drain terminals being coupled together; and a voltage generation circuit coupled between the bulk and gate terminals of the MOS device. The voltage generation circuit is configured to generate a voltage difference between the bulk and gate terminals of the MOS device during at least a portion of the ESD event. In this manner, a current handling capability of the MOS device is increased, thereby advantageously enabling a smaller sized device having a significantly smaller capacitance associated therewith to be employed in the ESD protection circuit.

In accordance with another aspect of the invention, an ESD protection circuit for protecting a circuit from an ESD event comprises an MOS device including a gate terminal, a first source/drain terminal, a second source/drain terminal and a bulk terminal, the bulk and first source/drain terminals being operatively coupled across the circuit to be protected, the bulk and second source/drain terminals being coupled together; and a voltage generation circuit coupled between the bulk and gate terminals of the MOS device, the voltage generation circuit being configured to generate a voltage difference between the bulk and gate terminals of the MOS device during at least a portion of the ESD event.

In an illustrative embodiment of the present invention, the MOS device comprises a first MOS device and the voltage generation circuit includes a second MOS device including a gate terminal, a first source/drain terminal and a second source/drain terminal, the gate and first source/drain terminals of the second MOS device being coupled to the second source/drain terminal of the first MOS device and the second source/drain terminal of the second MOS device being coupled to the bulk terminal of the first MOS device, and a passive element coupled between the gate and second source/drain terminals of the second MOS device.

These and other features and advantages of the present invention will become apparent from the following detailed description of illustrative embodiments thereof, which is to be read in connection with the accompanying drawings.

DETAILED DESCRIPTION OF THE PREFERRED EMBODIMENTS

Figure 1A:
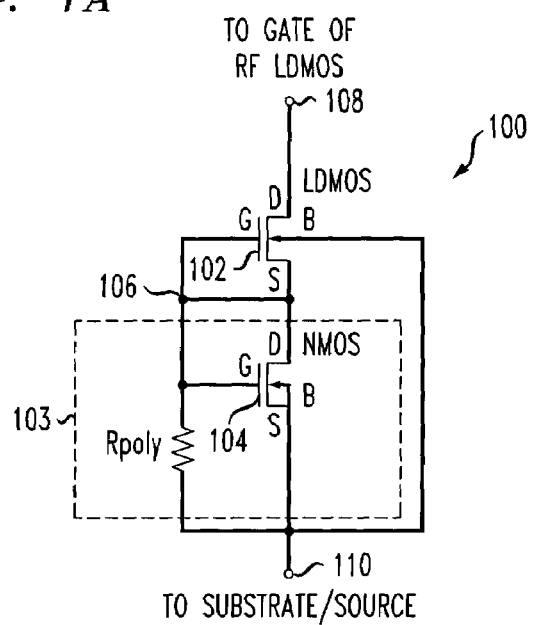
FIG. 1A is a schematic diagram illustrating an exemplary ESD protection circuit, in accordance with the present invention.

The present invention will be described herein in the context of an illustrative LDMOS integrated circuit fabrication technology suitable for forming discrete RF LDMOS transistors, as well as other devices and/or circuits. It should be appreciated, however, that the present invention is not limited to the fabrication of this or any particular transistor device or circuit. Rather, the invention is more generally applicable to ESD protection circuitry capable of being used in a high frequency (e.g., RF), high voltage, and/or power environment. Moreover, although implementations of the present invention are described herein with specific reference to an LDMOS fabrication process, it is to be appreciated that the invention is not limited to such a fabrication process, and that other suitable process technologies, such as, but not limited to, complementary metal-oxide-semiconductor (CMOS), bipolar complementary metal-oxide-semiconductor (BiCMOS), etc., may be similarly employed, as will be understood by those skilled in the art.

In principle, an ESD protection circuit is active only during an ESD event and forms a current discharge path for shunting the significantly large ESD current (e.g., on the order of several amperes), as well as clamping the voltage of input/output pads associated with the circuit being protected to a sufficiently low level to prevent the circuit being protected from experiencing irreversible damage. It is to be understood that a circuit being protected from the ESD event may comprise a single device, as in the case of a discrete device (e.g., a discrete RF LDMOS transistor), or a plurality of devices, which may be coupled together to form a larger circuit. An ESD event may be defined to include large voltage (e.g., on the order of several thousand volts) and/or large current (e.g., on the order of several amperes) transient pulses typically of less than about 100 nanoseconds (ns) in duration, not merely events that are electrostatic in nature.

As previously stated, conventional ESD protection circuits (e.g., zener diodes, grounded-gate NMOS devices, etc.) are generally not suitable for use in high frequency applications (e.g., above 1 gigahertz (GHz)) due, at least in part, to the large capacitance typically associated with ESD protection circuit. In addition, some conventional ESD protection circuits demonstrate other undesirable characteristics, such as, for example, being prone to false triggering during large signal operation of the device being protected, high leakage current, high and/or uncontrollable snapback voltage, large semiconductor area consumption, etc., as previously noted. The present invention provides an ESD protection circuit and methodologies which advantageously overcome the problems associated with conventional ESD protection schemes.

An RF LDMOS device is essentially a discrete RF power diffused metal-oxide-semiconductor (DMOS) device having three terminals, namely, a gate terminal (G), a source terminal (S) and a drain terminal (D), brought out in a package, for example, as pins. Since the three terminals are brought out in the package and may thus be externally contacted, the RF LDMOS device requires ESD circuitry to protect the device from damage resulting from an ESD event. In a preferred embodiment of the invention, the ESD protection circuitry employed is compatible with the structure and technology of the RF LDMOS device itself, or alternative circuit to be protected. Consequently, no additional mask levels and corresponding fabrication steps are required to form the device.

With the RF LDMOS device typically being configured so that its source terminal is an RF ground of the device (e.g., by connecting the source terminal to a substrate of the device), the gate terminal may be considered an input of the device and the drain terminal may be considered an output of the device. The primary focus of the ESD protection circuit, as with any discrete MOS device, is the protection of the gate (input) terminal relative to the source terminal of the device, or, in the exemplary case where the source terminal is connected to the substrate, protection of the gate terminal relative to the substrate of the device.

FIG. 1A illustrates a schematic diagram of an exemplary ESD protection circuit 100, formed in accordance with one aspect of the invention. The exemplary ESD protection circuit 100 comprises a first node 108, which may be coupled to the gate terminal of an RF LDMOS device (not shown) being protected, and a second node 110, which may be coupled to the source terminal of the RF LDMOS device. As previously explained, the RF LDMOS device is typically configured such that its source terminal is connected to the substrate of the device, thereby forming an RF ground. The ESD protection circuit 100 functions, at least in part, to prevent a voltage difference between the gate and source terminals of the RF LDMOS device from exceeding a predetermined level during an ESD event, which would otherwise damage the gate oxide associated with the RF LDMOS device. Thus, the ESD protection circuit 100 is preferably configured so as to effectively clamp the voltage across nodes 108 and 110 at a predetermined voltage level which is lower than a breakdown voltage of the gate oxide in the RF LDMOS device.

The exemplary ESD protection circuit 100 includes an LDMOS transistor 102 having a gate terminal (G), a source terminal (S), a drain terminal (D) and a body or bulk terminal (B). An LDMOS device is typically highly asymmetrical, and therefore source and drain designations are not necessarily arbitrarily assignable. It is to be appreciated, however, that in the case of a simple MOS device, which is symmetrical and thus functions in a bidirectional manner, the assignment of drain and source terminal designations is essentially arbitrary. Consequently, the drain and source terminals may be referred to generally herein as first and second source/drain terminals.

The term "source/drain terminal" as used herein is intended to include, without limitation, a source terminal or a drain terminal.

The LDMOS transistor 102 primarily functions to shunt at least a substantial portion of the current generated by an ESD event, thereby protecting the RF LDMOS device, coupled to nodes 108 and 110, from damage. It is to be appreciated that alternative devices, such as, but not limited to, a lightly-doped drain (LDD) NMOS device having a controllable breakdown voltage or a bipolar transistor, may be employed in place of LDMOS device 102. The LDMOS device 102 may be configured such that its gate and source terminals are coupled together at node 106. Conventionally, the ESD protection device is often connected in a grounded-gate configuration, whereby the gate and source terminals of the ESD protection device are connected to ground, which maybe the substrate. This is not the case in the exemplary ESD protection circuit 100 of the present invention.

An important aspect of the present invention is that the LDMOS device 102 is configured such that there is a difference in voltage between the gate and bulk terminals of the device 102 during at least a portion of an ESD event. Configuring the LDMOS device 102 in this manner advantageously enables the device 102 to significantly increase its current handling capability without increasing the size of the device. Additionally, by adjusting the voltage difference between the gate and bulk terminals of the LDMOS device 102, the point at which the device is triggered (i.e., becomes active) can be selectively adjusted as desired, thereby allowing the device to turn on sooner (or later) in response to the ESD event. This feature of the present invention is desirable since the ESD event is typically of short duration (e.g., less than 100 ns), and therefore a delay in the triggering of the ESD protection circuit can allow the voltage across the gate-source region of the protected device to rise beyond an acceptable level, thereby potentially damaging the protected device.

One way to generate a potential difference between the bulk terminal of the device 102, which may be coupled to the substrate, and the gate terminal of the device is to connect a voltage generation circuit 103 between the gate and bulk terminals of the LDMOS device 102. Although the voltage generation circuit 103 may comprise a simple passive element (not shown), for example, a resistor, connected between the gate terminal of device 102 and the substrate, voltage generation circuit 103 preferably comprises an active device (e.g., MOS transistor). Employing an active device for generating the voltage difference between the gate and bulk terminals of the LDMOS device 102 during the ESD event is advantageous in that it can be more easily integrated with the device being protected using conventional IC fabrication technology. Furthermore, the characteristics of an active device are well defined and more easily controllable, based at least in part on the particular fabrication process technology employed.

In accordance with another illustrative embodiment of the invention (not shown), rather than utilizing a grounded-gate configuration, the source and bulk terminals of the LDMOS device may be connected together, and in turn coupled to the substrate. With the gate terminal uncoupled from the source terminal of the LDMOS device, a voltage difference may be generated between the gate and bulk terminals of the LDMOS device by connecting the voltage generation circuit between the gate terminal of the LDMOS device and the substrate. Regardless of the configuration employed in the ESD protection circuit, a primary aspect of the invention involves generating a difference in voltage between the gate and bulk terminals of the LDMOS device during at least a portion of the ESD event.

As apparent from FIG. 1A, the voltage generation circuit 103 of the exemplary ESD protection circuit 100 comprises an NMOS device 104 having a gate terminal (G), a source terminal (S), a drain terminal (D), and a bulk terminal (B). It is to be appreciated that an alternative device, such as, for example, a bipolar transistor, may be employed in place of, or in conjunction with, NMOS device 104. The NMOS device 104 is configured such that its gate and drain terminals are coupled to the gate terminal of the LDMOS device 102 at node 106 and its source and bulk terminals are connected to the substrate at node 110. NMOS device 104 is preferred, compared to using a simple resistor, for providing a voltage difference between the source and bulk terminals of LDMOS device 102, at least in part since the current shunting capability of the NMOS device 104 increases with the gate voltage in a square law relationship. The NMOS device 104 also includes a parasitic bipolar transistor (not shown) associated therewith which helps protect the device 104 and allows it to handle a higher level of current during the ESD event. Furthermore, an MOS device is generally easier to fabricate and consumes less chip area compared to a resistor.

When a voltage greater than a threshold voltage ($V_T$) of the NMOS device 104 is presented between the gate and source terminals of the device 104 (e.g., during an ESD event), the device 104 will begin to turn on (i.e., become active), thereby conducting a drain current ($I_D$) through the device. When NMOS device 104 is active, a voltage ($V_{DS}$) will appear across the drain and source terminals of the device in accordance with a well known drain current relation for an MOS transistor:

$$I_D = \frac{K'W}{L}\left[(V_{GS} - V_T)V_{DS} - \frac{V_{DS}^2}{2}\right],$$

where K' is a constant corresponding to certain fabrication characteristics of the MOS transistor device (including oxide thickness ($t_{OX}$), oxide capacitance ($C_{OX}$), etc.), W is an effective channel width of the transistor, L is an effective channel length of the transistor, $V_{GS}$ is a gate-to-source voltage of the device, and $V_{DS}$ is a drain-to-source voltage of the device, as will be understood by those skilled in the art.

When NMOS device 104 is turned off (i.e., inactive), the voltage at its drain terminal, and thus the source terminal of LDMOS device 102, may be undefined. In order to avoid this situation, the exemplary ESD protection circuit 100 includes a resistor Rpoly, which may be formed of polysilicon material, connected in parallel with NMOS device 104, between the source terminal of LDMOS device 102 at node 106 and the substrate at node 110. It is to be appreciated that resistor Rpoly is not limited to being formed of polysilicon, but rather may be formed of an alternative material, such as, for example, diffusion, well (n-type or p-type), etc., as will be understood by those skilled in the art. Resistor Rpoly functions, at least in part, to provide a parallel current path for shunting at least a portion of the ESD current, particularly while the NMOS device 104 is turned off.

As the current through resistor Rpoly increases, the voltage across the resistor, and thus across the gate-source terminals of NMOS device 104, will increase until the threshold voltage of the device 104 is reached, at which point device 104 turns on and provides a parallel current path for shunting the ESD current. As the voltage across the resistor Rpoly continues to rise, a proportionally larger amount of the total ESD current will flow through NMOS device 104 compared to resistor Rpoly, due at least in part to the square law relationship of the NMOS device, as previously stated. If a passive element (e.g., resistor) is employed in place of NMOS device 104 for providing the voltage difference between the bulk and source terminals of LDMOS device 102, resistor Rpoly may be eliminated, since a current path between the source terminal of LDMOS device 102 and the substrate will therefore always exist, independent of the voltage level present between the source terminal of the LDMOS device 102 and the substrate.

Figure 1B:
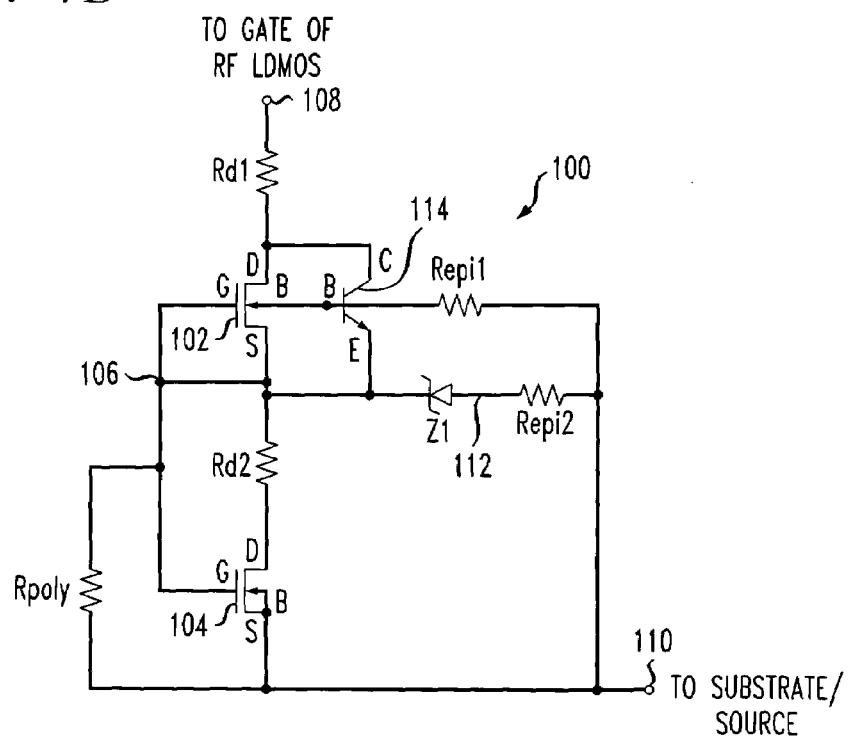
FIG. 1B is a schematic diagram illustrating the exemplary ESD protection circuit of FIG. 1A with parasitic components corresponding thereto.

FIG. 1B illustrates the exemplary ESD protection circuit 100 of FIG. 1A, shown with certain parasitic components associated therewith. As will be understood by those skilled in the art, for ease of explanation, not all parasitic components associated with the ESD protection circuit 100 are shown. As apparent from the figure, ESD protection circuit 100 includes a parasitic resistor Rd1 corresponding to a drain resistance of LDMOS device 102. Resistor Rd1 may be coupled between the drain terminal of LDMOS device 102 and node 108. Likewise, NMOS device 104 includes a resistor Rd2 corresponding to a drain resistance of NMOS device 104. Resistor Rd2 maybe coupled between the drain terminal of NMOS device 104 and the source terminal of LDMOS device 102 at node 106. Drain resistors Rd1 and Rd2 are generally small in value, e.g., about 50 to 100 ohms. Circuit 100 may also include parasitic resistors Repi1 and Repi2, corresponding to a resistance of an epitaxial region associated with the fabricated ESD protection circuit 100. Resistor Repi1 is shown coupled between the bulk terminal of the LDMOS device 102 and the substrate at node 110. Resistor Repi2 is coupled between the substrate at node 110 and node 112.

The ESD protection circuit 100 further includes a parasitic zener diode Z1. An anode of the diode Z1 is coupled to resistor Repi2 at node 112 and a cathode of the diode is coupled to the source terminal of LDMOS device 102 at node 106. The parasitic zener diode Z1 may be formed by the source terminal of LDMOS device 102, which may comprise n$^+$-type material, and the bulk terminal of LDMOS device 102, which may comprise p$^+$ material. The zener diode Z1 functions, in at least one aspect, to limit the voltage at the gate terminals of LDMOS device 102 and NMOS device 104, thus advantageously providing a self protection mechanism for the gate oxides associated with the ESD protection devices 102, 104 themselves.

A parasitic lateral bipolar transistor 114 associated with the LDMOS device 102 provides an additional current path for shunting at least a portion of the current generated during the ESD event. The parasitic bipolar transistor 114 includes a collector terminal, which may be formed from the drain (n+ diffusion region) of the LDMOS device 102, a base terminal (B), which may be formed from the bulk (p-channel diffusion region) of the LDMOS device, and an emitter terminal (E), which may formed from the source (n+ diffusion region) of the LDMOS device. As the current in the LDMOS device 102 increases, the parasitic bipolar transistor 114 enters a snapback mode of operation, wherein the voltage across the base-emitter junction is effectively clamped while the collector current flowing through the bipolar device 114 is allowed to rise. At this point, the collector current is distributed substantially uniformly across an active area of the device 114 to prevent current filamentation, which can cause the temperature of the device to rise leading to the onset of device destruction.

What initiates the ESD protection circuit 100 is the breakdown of the LDMOS device 102. The breakdown voltage of the LDMOS device 102 may be adjusted as desired, for example, by modifying one or more fabrication properties of the device. Ideally, the breakdown voltage of the LDMOS device 102 should be made higher than an anticipated input voltage swing of the device being protected in order to avoid false triggering of the ESD protection circuit, but not too high such that damage to the gate oxide of the device being protected occurs during the ESD event. Preferably, the breakdown voltage of the device 102 is set to be about 18 volts (V) for a device having a gate oxide thickness of about 300 angstroms.

Figure 2:
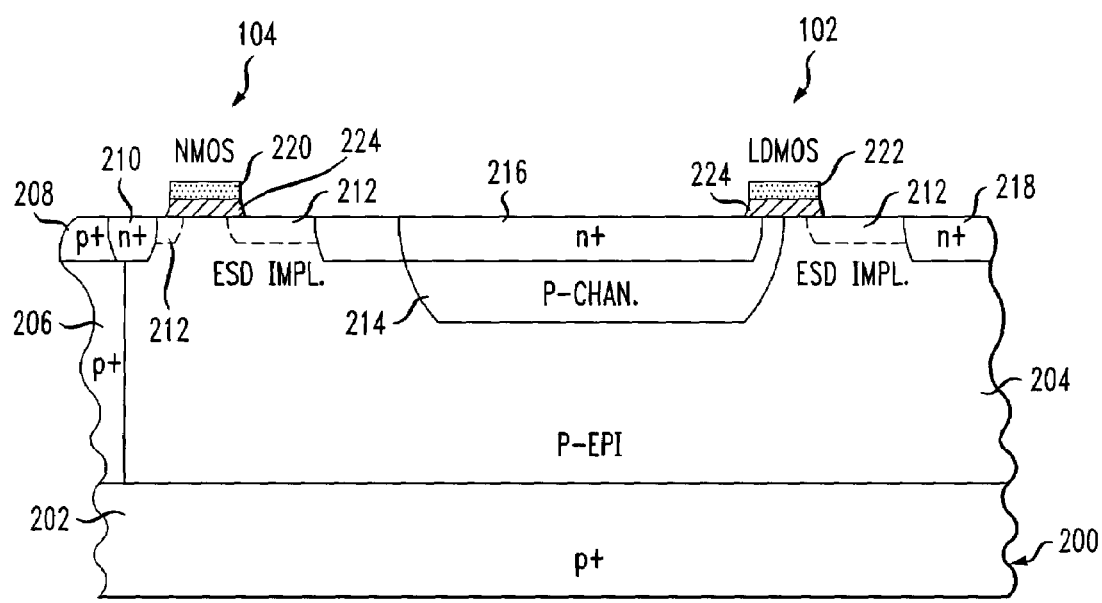
FIG. 2 is a cross-sectional view illustrating at least a portion of the exemplary ESD protection circuit shown in FIGS. 1A and 1B, in accordance with the present invention.

FIG. 2 illustrates a cross-sectional view of at least a portion of an exemplary semiconductor wafer 200 in which the techniques of the present invention may be implemented. It is to be appreciated that the various layers and/or regions shown in the figure may not be drawn to scale. Furthermore, for ease of explanation, one or more layers of the exemplary wafer may have been intentionally omitted (e.g., metal contact layer), as will be understood by those skilled in the art.

The exemplary wafer 200 includes an LDMOS device 102 and an NMOS device 104 formed on a substrate 202. The substrate 202 is commonly formed of single-crystal silicon. Additionally, the substrate may have been modified by adding an impurity or dopant, such as by a diffusion or implant step, to change the conductivity of the material (e.g., n-type or p-type). In the illustrative embodiment shown in FIG. 2, for example, a p-type substrate 202 is employed, with a typical impurity concentration on the order of $10^{16}$ atoms per cubic centimeter (cm$^3$).

The term "substrate" as used herein refers to any material upon which other materials may be formed. The semiconductor wafer 200 comprises the substrate 202, with or without an epitaxial layer 204, and preferably includes one or more other layers formed on the substrate. The term "wafer" is often used interchangeably with the term "silicon body," since silicon is typically employed as the semiconductor material comprising the wafer. It should be appreciated that although the present invention is illustrated herein using a portion of a semiconductor wafer, the term "wafer" may include a multiple-die wafer, a single-die wafer, or any other arrangement of semiconductor material on which a circuit element may be formed.

In order to contact the substrate 202, a trench sinker 206 may be formed from an upper surface of the wafer 200, through the epitaxial layer 204, to the substrate 202. The trench sinker 206 can be formed, for example, by etching a trench through the epitaxial layer 204 to expose the substrate 202 by an etching process, such as, but not limited to, wet etching (e.g., hydrofluoric acid (HF), phosphoric acid, etc.), dry or plasma etching, or a combination of dry etching and wet etching (e.g., reactive-ion etching (RIE)), as will be understood by those skilled in the art. Subsequently, an impurity, such as, for example, boron, may be deposited on the sidewalls of the trench using a conventional diffusion process, thereby creating a low resistance path. The trench can then be filled with a plug comprising a material, such as, but not limited to, polysilicon or metal (e.g., tungsten). The trench sinker may be capped with a p+ material to form a substrate connection 208.

A source terminal of the NMOS device 104 may be formed as an n+ diffusion region 210 in the epitaxial layer 204 using known diffusion techniques. The n+ diffusion region 210 is preferably formed such that an electrical connection is made to the substrate 202 through substrate connection 208. Preferably, since the n+ source 210 and the p+ substrate connection 208 may undesirably form an active junction, the n+ source 210 and p+ substrate connection 208 are connected through a low resistance shorting metal (not shown), which may comprise gold, etc. By doing so, the p-n junction effect is substantially eliminated.

The LDMOS device 102 is preferably fabricated in the epitaxial layer 204 by first forming a bulk (i.e., body) channel region 214, which may be doped with a p-type impurity. This may be accomplished by patterning the wafer, such as with one or more photolithographic masks, and implanting the p-type impurity (e.g., boron), with a typical impurity concentration on the order of about $10^{14}$ atoms per cubic centimeter ($cm^3$), into the epitaxial layer 204 using a conventional implantation process, as will be understood by those skilled in the art. An n+ drain region 218 of the LDMOS device 102 may be formed in the epitaxial layer 204 by patterning the wafer and implanting an n-type impurity (e.g., arsenic or phosphorus) with an impurity concentration on the order of about $10^{12}$ atoms per $cm^3$. Likewise, an n+ source region 216 of the LDMOS device 102 may be formed at least partially in the channel region 214 by patterning the wafer and implanting an n-type impurity (e.g., arsenic or phosphorus) with a predetermined impurity concentration (e.g., about $10^{16}$ atoms per square centimeter). The n+ source region 216 of the LDMOS device 102 may extend beyond the channel region 214 and form the drain of NMOS device 104, which, as shown in FIGS. 1A and 1B, is connected to the source of the LDMOS device 102.

The LDMOS device 102 and the NMOS device 104 are preferably formed with one or more ESD implant regions 212. By varying a doping level and/or location of the ESD implant regions 212, the ESD implant regions can be used to selectively control the breakdown voltage point corresponding to each of the devices 102, 104. The ESD implant regions 212 may be formed in the epitaxial layer 204, primarily on the drain side of each device and inside the device structure (although not limited to the drain side), by patterning the wafer and implanting an n-type impurity (e.g., arsenic or phosphorus) of light to moderate concentration (e.g., on the order of about $10^{13}$ atoms per $cm^3$). It is to be appreciated that the ESD implant regions 212 are not limited to the precise locations shown in the figure.

In an alternative embodiment, when the circuit to be protected from the ESD event comprises a discrete RF LDMOS device, the ESD implant step may be eliminated and instead formed using one or more LDD implant steps, as used in the fabrication of the RF LDMOS device being protected. In this manner, no additional IC fabrication steps are required, thus saving manufacturing cost. Since the implant region formed using the LDD implant step may be more lightly doped in comparison to using a separate ESD implant step, the LDD regions (not shown) may be spaced further from gate terminals 222 and 220 of devices 102 and 104, respectively. The gate terminals 222, 220 are electrically isolated from the drain and source regions 218, 216, 210 of the respective LDMOS and NMOS devices by an insulating layer 224, which may comprise, for example, silicon dioxide. The breakdown voltage of each of the devices 102, 104 may be controlled, at least in part, by selectively adjusting the cross-sectional thickness of the insulating layer 224.

Figure 3:
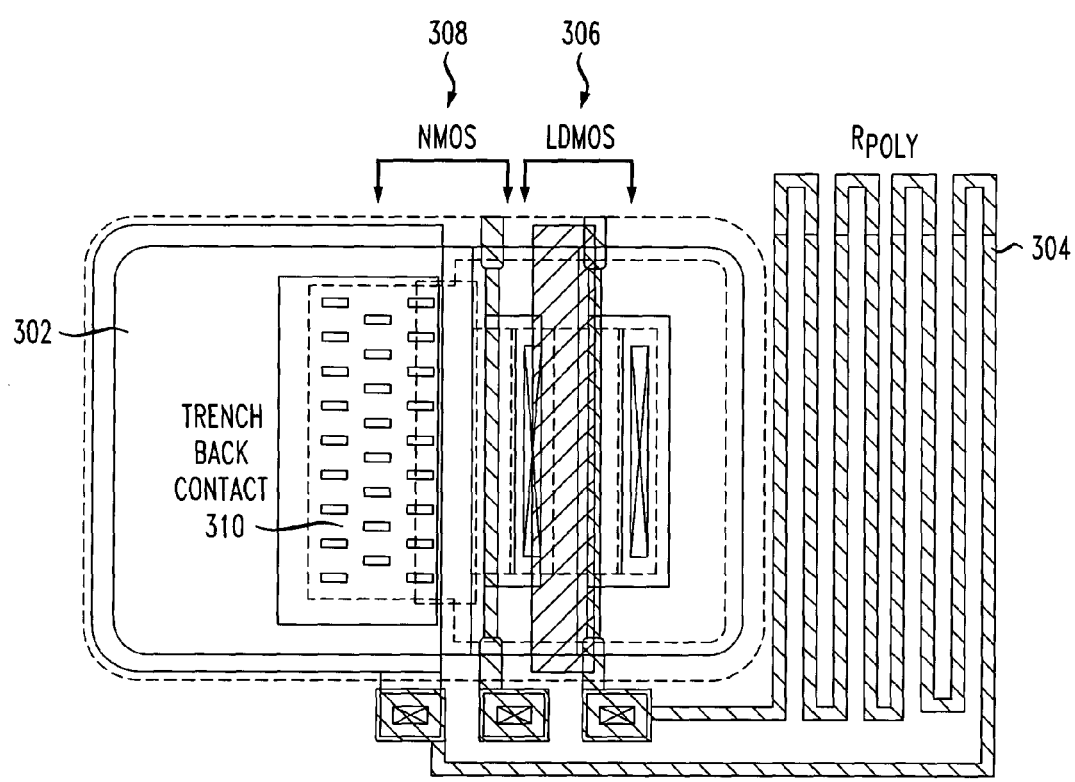
FIG. 3 is a top plan view illustrating at least a portion of an exemplary ESD protection circuit, formed in accordance with the present invention.

FIG. 3 illustrates a top plan view showing an exemplary layout of at least a portion of the ESD protection circuit previously described in conjunction with FIG. 1A, in accordance with one aspect of the invention. As apparent from the figure, the exemplary ESD protection circuit comprises an LDMOS device 306, an NMOS device 308, and a resistor 304 formed of polysilicon. A trench back contact 310 may be used to connect the ESD protection circuit to the substrate. The ESD protection circuit may be fabricated in close relative proximity to a bond pad 302 to which the circuit to be protected is coupled. More than one ESD circuit may be employed in connection with the protected circuit for sharing the ESD current. For example, in a preferred embodiment of the invention, two ESD protection circuits are used on either side of the chip.

By way of example only, operation of the exemplary ESD protection circuit 100 during an ESD event will now be described, using the illustrative characteristics shown in Table 1 below for LDMOS device 102, NMOS device 104, resistors Rpoly, Rd1, Rd2, and zener diode Z1.

TABLE 1

| LDMOS | NMOS | Resistors | Diode Z1 |
|---|---|---|---|
| L = 1.4 μm | L = 1.4 μm | Rpoly = 400 ohm | BV = 6.0 volts |
| W = 30 μm | W = 30 μm | Rd1 = 87 ohms | |
| $V_T$ = 3.65 volts | $V_T$ = 0.65 volt | Rd2 = 87 ohms | |
| BV = 18 volts | BV = 6.0 volts | | |

In Table 1 above, L and W are the effective lengths and widths, respectively, of the corresponding LDMOS and NMOS devices, $V_T$ is the threshold voltage, and BV is the breakdown voltage.

As current begins to flow in the ESD protection circuit 100 resulting from the breakdown of the LDMOS device 102 during the ESD event, it will bypass the NMOS device 104, which is turned off and flow through the resistor Rpoly to the substrate. At a current level of about 1.6 milliamperes (ma), the voltage across resistor Rpoly begins to approach the threshold voltage $V_T$ of NMOS device 104. As the current continues to rise, the NMOS device turns on and shares the ESD current with the resistor Rpoly, thus providing a parallel path for current flow. As the current increases further, the voltage across the NMOS device 104 reaches 6 volts, which is the breakdown voltage set by the zener diode Z1. This limits the voltage drop across the gates of both the LDMOS device 102 and the NMOS device 104, thereby providing an elegant self protection mechanism for the gate oxides of the ESD protection devices themselves. At this point, the total voltage across the ESD circuit (between nodes 108 and 110) should not increase to a level close to the oxide breakdown voltage, which is set primarily by the thickness of the gate oxide of the devices.

As the voltage and current levels in the ESD circuit 100 increase, a snapback mechanism occurs primarily as a result of the parasitic bipolar transistor 114. The drain voltage of the NMOS device 104, being tied to the gate voltages of both the LDMOS device 102 and NMOS device 104, provides for a gate coupling effect that enhances the snapback characteristics. The snapback mechanism occurs at a current of about 26 ma. It is important to insure that a second breakdown voltage, a destructive breakdown condition leading to current filamentation and the eventual destruction of the LDMOS device 102, is not reached before the snapback condition. Even after snapback occurs, current should remain substantially uniform across the width of the device 102. This enables a device having a gate width of about 30 μm to handle above one ampere of current for the duration of the ESD event. Before snapback, the average resistance across the ESD circuit is in the range of about 300 ohms. After snapback, the effective resistance across the ESD circuit drops to about 20 ohms.

Figure 4:
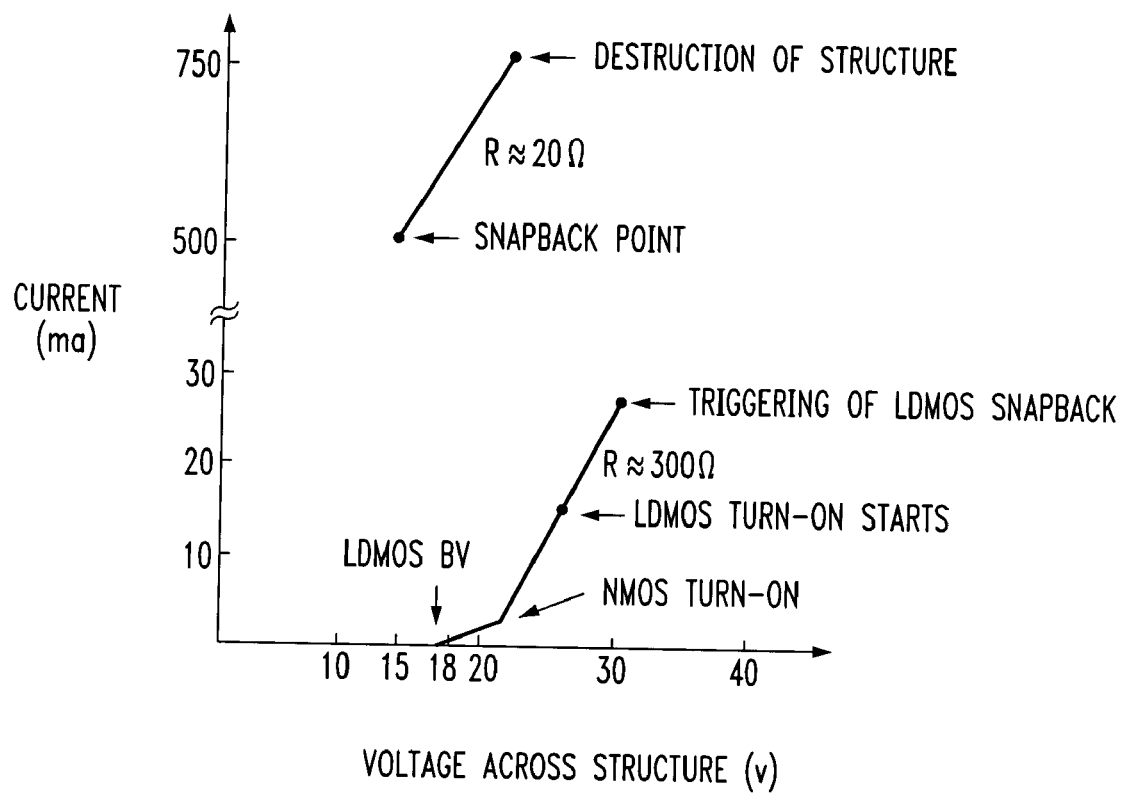
FIG. 4 is a graphical illustration depicting exemplary electrical characteristics of the ESD protection circuit shown in FIGS. 1A and 1B, in accordance with the present invention.

The effective capacitance of the exemplary ESD circuit 100, as configured using the illustrative parameters of Table 1, was measured to be about 0.47 picofarad (pF) at zero volts, and about 0.28 pF at 15 volts. FIG. 4 depicts a graphical illustration of certain electrical characteristics of the exemplary ESD protection circuit. Current-voltage (I-V) measurements for the ESD protection circuit were obtained at both direct current (DC) and pulsed I-V (e.g., using transmission line pulsing (TLP) techniques) at low current levels (e.g., from about 0 to about 25 ma) and high current levels (e.g., from about 500 ma to about 1750 ma).

Although illustrative embodiments of the present invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. An electrostatic discharge (ESD) protection circuit for protecting a circuit from an ESD event, the ESD protection circuit comprising:
    a first metal-oxide semiconductor (MOS) device including a gate terminal, a first source/drain terminal, a second source/drain terminal and a bulk terminal, the bulk and first source/drain terminals being operatively coupled across the circuit to be protected, the gate and second source/drain terminals being coupled together; and
    a voltage generation circuit coupled between the bulk and gate terminals of the first MOS device, the voltage generation circuit being configured to generate a voltage difference between the bulk and gate terminals of the first MOS device during at least a portion of the ESD event;
    wherein the voltage generation circuit comprises:
        a second MOS device including a gate terminal, a first source/drain terminal and a second source/drain terminal, the gate and first source/drain terminals of the second MOS device being coupled to the second source/drain terminal of the first MOS device and the second source/drain terminal of the second MOS device being coupled to the bulk terminal of the first MOS device; and
        a passive element coupled between the gate and second source/drain terminals of the second MOS device.

2. The circuit of claim 1, wherein the first source/drain terminal comprises a drain terminal and the second source/drain terminal comprises a source terminal.

3. The circuit of claim 1, wherein the first MOS device comprises a diffused MOS (DMOS) device, the first source/drain terminal comprising a drain terminal, the second source/drain terminal comprising a source terminal, the bulk and drain terminals being operatively coupled across the circuit to be protected, the gate and source terminals being coupled together, the voltage generation circuit being coupled between the bulk and source terminals of the DMOS device.

4. The circuit of claim 3, wherein the first MOS device comprises a lateral DMOS (LDMOS) device.

5. The circuit of claim 1, wherein the first MOS device comprises a lightly-doped drain (LDD) n-channel MOS (NMOS) device having a controllable breakdown voltage associated therewith.

6. The circuit of claim 1, wherein the voltage generation circuit comprises a resistor coupled between the bulk and second source/drain terminals of the first MOS device.

7. The circuit of claim 1, wherein the first MOS device is a diffused MOS (DMOS) device and the second MOS device is an n-channel MOS (NMOS) device.

8. The circuit of claim 1, wherein:
    the second MOS device includes a bulk terminal; and
    the voltage generation circuit further comprises a second voltage generation circuit coupled between the bulk and gate terminals of the second MOS device, the second voltage generation circuit being configured to generate a voltage difference between the bulk and gate terminals of the second MOS device during at least a portion of the ESD event.

9. An electrostatic discharge (ESD) protection circuit for protecting a circuit from an ESD event, the ESD protection circuit comprising:
    a metal-oxide semiconductor (MOS) device including a gate terminal, a first source/drain terminal, a second source/drain terminal and a bulk terminal, the bulk and first source/drain terminals being operatively coupled across the circuit to be protected, the gate and second source/drain terminals being coupled together; and
    a voltage generation circuit coupled between the bulk and gate terminals of the MOS device, the voltage generation circuit being configured to generate a voltage difference between the bulk and gate terminals of the MOS device during at least a portion of the ESD event;
    wherein the voltage generation circuit comprises:
        a bipolar junction device including a base terminal, an emitter terminal and a collector terminal, the base and collector terminals of the bipolar junction device being coupled to the second source/drain terminal of the MOS device and the emitter terminal of the bipolar junction device being coupled to the bulk terminal of the MOS device; and
        a passive element coupled between the base and emitter terminals of the bipolar junction device.

10. An electrostatic discharge (ESD) protection circuit for protecting a circuit from an ESD event, the ESD protection circuit comprising:
    a metal-oxide semiconductor (MOS) device including a gate terminal, a first source/drain terminal, a second source/drain terminal and a bulk terminal, the bulk and first source/drain terminals being operatively coupled across the circuit to be protected, the bulk and second source/drain terminals being directly coupled together, the gate terminal being uncoupled from the second source/drain terminal; and
    a voltage generation circuit coupled between the bulk and gate terminals of the MOS device, the voltage generation circuit being configured to generate a voltage difference between the bulk and gate terminals of the MOS device during at least a portion of the ESD event.

11. A semiconductor device, comprising:
    at least one circuit to be protected from an electrostatic discharge (ESD) event; and
    at least one ESD protection circuit operatively coupled to the at least one circuit, the at least one ESD protection circuit comprising:
        a first metal-oxide semiconductor (MOS) device including a gate terminal, a first source/drain terminal, a second source/drain terminal and a bulk terminal, the bulk and first source/drain terminals being operatively coupled across the circuit to be protected, the gate and second source/drain terminals being coupled together; and a voltage generation circuit coupled between the bulk and gate terminals of the first MOS device, the voltage generation circuit being configured to generate a voltage difference between the bulk and gate terminals of the first MOS device during at least a portion of the ESD event;

wherein the voltage generation circuit comprises:

a second MOS device including a gate terminal, a first source/drain terminal and a second source/drain terminal, the gate and first source/drain terminals of the second MOS device being coupled to the second source/drain terminal of the first MOS device and the second source/drain terminal of the second MOS device being coupled to the bulk terminal of the first MOS device; and a passive element coupled between the gate and second source/drain terminals of the second MOS device.

12. The semiconductor device of claim 11, wherein the first source/drain terminal comprises a drain terminal and the second source/drain terminal comprises a source terminal.

13. The semiconductor device of claim 11, wherein the first MOS device comprises a diffused MOS (DMOS) device, the DMOS device including a gate terminal, a source terminal, a drain terminal and a bulk terminal, the bulk and drain terminals being operatively coupled across the circuit to be protected, the gate and source terminals being coupled together, the voltage generation circuit being coupled between the bulk and source terminals of the DMOS device.

14. The semiconductor device of claim 13, wherein the first MOS device comprises a lateral DMOS (LDMOS) device.

15. The semiconductor device of claim 11, wherein the first MOS device comprises a lightly-doped drain (LDD) n-channel MOS (NMOS) device having a controllable breakdown voltage associated therewith.

16. The semiconductor device of claim 11, wherein the voltage generation circuit comprises a resistor coupled between the bulk and second source/drain terminals of the first MOS device.

17. The semiconductor device of claim 11, wherein the MOS device is a diffused MOS (DMOS) device and the second MOS device is an n-channel MOS (NMOS) device.

18. The semiconductor device of claim 11, wherein:

the second MOS device includes a bulk terminal; and the voltage generation circuit further comprises a second voltage generation circuit coupled between the bulk and second source/drain terminals of the second MOS device, the second voltage generation circuit being configured to generate a voltage difference between the bulk and second source/drain terminals of the second MOS device during at least a portion of the ESD event.

19. A semiconductor device, comprising:

at least one circuit to be protected from an electrostatic discharge (ESD) event; and at least one ESD protection circuit operatively coupled to the at least one circuit, the at least one ESD protection circuit comprising:

a metal-oxide semiconductor (MOS) device including a gate terminal, a first source/drain terminal, a second source/drain terminal and a bulk terminal, the bulk and first source/drain terminals being operatively coupled across the circuit to be protected, the gate and second source/drain terminals being coupled together; and a voltage generation circuit coupled between the bulk and gate terminals of the MOS device, the voltage generation circuit being configured to generate a voltage difference between the bulk and gate terminals of the MOS device during at least a portion of the ESD event;

wherein the voltage generation circuit comprises:

a bipolar junction device including a base terminal, an emitter terminal and a collector terminal, the base and collector terminals of the bipolar junction device being coupled to the second source/drain terminal of the MOS device and the emitter terminal of the bipolar junction device being coupled to the bulk terminal of the MOS device; and a passive element coupled between the base and emitter terminals of the bipolar junction device.

20. A semiconductor device, comprising:

at least one circuit to be protected from an electrostatic discharge (ESD) event; and at least one ESD protection circuit operatively coupled to the at least one circuit, the at least one ESD protection circuit comprising:

a metal-oxide semiconductor (MOS) device including a gate terminal, a first source/drain terminal, a second source/drain terminal and a bulk terminal, the bulk and first source/drain terminals being operatively coupled across the circuit to be protected, the bulk and second source/drain terminals being directly coupled together, the gate terminal being uncoupled from the second source/drain terminal; and a voltage generation circuit coupled between the bulk and gate terminals of the MOS device, the voltage generation circuit being configured to generate a voltage difference between the bulk and gate terminals of the MOS device during at least a portion of the ESD event.

* * * * *